US006969985B2

(12) United States Patent
McMorrow (10) Patent No.: US 6,969,985 B2
(45) Date of Patent: Nov. 29, 2005

(54) ACTIVE COUPLER

(75) Inventor: Robert J. McMorrow, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 650 days.

(21) Appl. No.: 10/016,976

(22) Filed: Dec. 14, 2001

(65) Prior Publication Data

US 2003/0111997 A1 Jun. 19, 2003

(51) Int. Cl.[7] .............................................. G01R 23/04
(52) U.S. Cl. ..................................... 324/95; 324/158.1
(58) Field of Search ............................... 324/95, 158.1, 324/94, 501, 51, 432; 333/17.3, 32; 455/125, 121, 123

(56) References Cited

U.S. PATENT DOCUMENTS

| 4,990,803 A | 2/1991 | Gilbert ........................ 307/492 |
| 5,857,039 A | * 1/1999 | Bosc et al. ..................... 385/14 |
| 6,429,720 B1 | 8/2002 | Gilbert ........................ 327/348 |
| 6,600,307 B2 | * 7/2003 | Geller et al. ................... 324/95 |

FOREIGN PATENT DOCUMENTS

| WO | WO 99/39449 | 8/1999 | ............ H04B/1/40 |
| WO | WO 99/67893 | 12/1999 | ............ H04B/1/40 |

* cited by examiner

*Primary Examiner*—Evan Pert
*Assistant Examiner*—Trung Q Nguyen
(74) *Attorney, Agent, or Firm*—Bromberg & Sunstein LLP (57) ABSTRACT

A coupler circuit for sampling an output power of a signal from an output power source has at least one first sampling element for sampling a first portion of the signal and at least one second sampling element for sampling a second portion of the signal. The first sampling element and the second sampling element are separated by an output matching network defined by a set of S-parameters. A processor coupled to the at least one first and second sampling elements determines the output power based on at least the first portion of the signal and the second portion of the signal. A detector may be coupled to the processor to measure whether the first and second portion of the signal or the output power determined by the processor.

26 Claims, 6 Drawing Sheets

ACTIVE COUPLER

FIELD OF THE INVENTION

The invention relates generally to power detection circuits and, more particularly, to devices used to sample output power.

BACKGROUND OF THE INVENTION

Many applications that involve signal transmission (e.g., radio frequency (RF) and microwave signals) require some means of power measurement and control for the transmitted power of the signals. For example, a mobile handset terminal (e.g., a mobile phone) requires power monitoring and control to ensure compliance with regulations imposed on RF emissions and output power. GSM (Global System for Mobile communication) systems have strict power ramping requirements. CDMA (code-division multiple access) systems may implement power detection to conserve current and prolong talk time.

Figure 1:
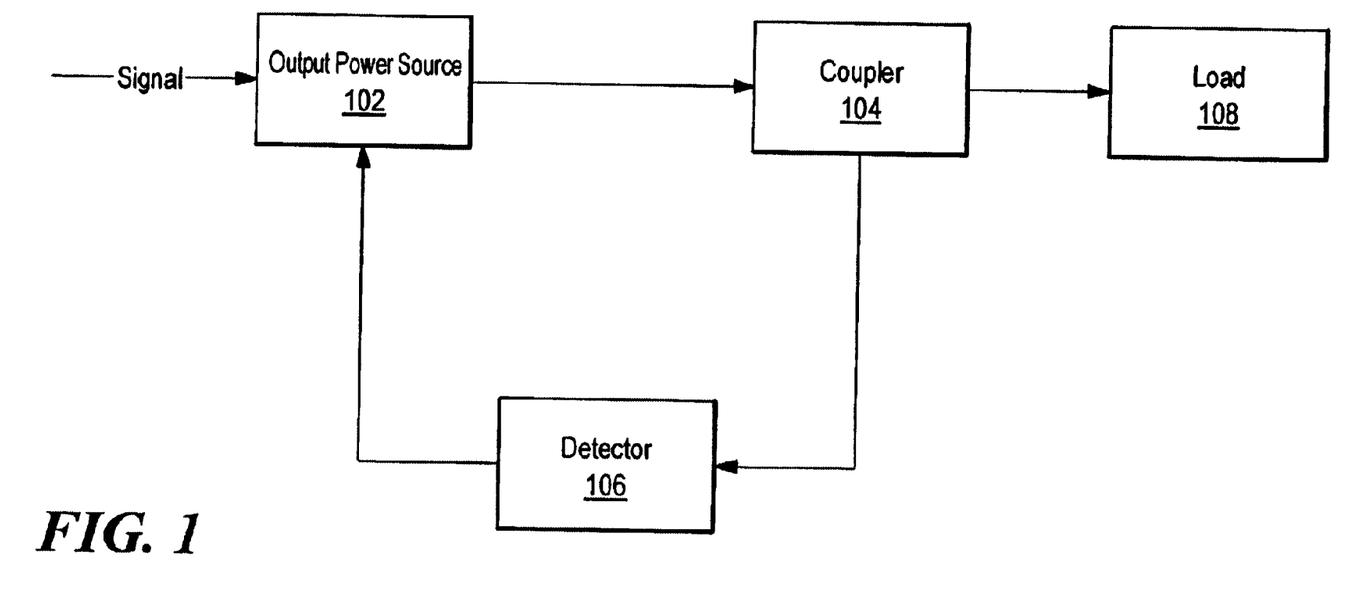
FIG. 1 is a schematic block diagram of a power system including a power control loop.

Typically, power measurement and control for a mobile handset device is performed using a power control loop, such as that shown in FIG. 1. An output power source 102 (e.g., a power amplifier or power amplifier module) is used to increase the power level of a signal to a required power level and deliver the signal to a load 108 (e.g., an antenna). A coupler 104 is used in the power control loop to sample a portion of the output power delivered to the load 108 and deliver the sampled output power to a detector circuit 106 to measure the output power of the signal. Key parameters of a coupler are typically insertion loss, coupling factor, size and directivity (or isolation).

In the prior art, a simple coupler may be made by using a capacitor and resistor to tap off the voltage waveform of the signal at the output of the output power source. Such a coupler provides very low insertion loss but almost no directivity. Thus any reflection at the output of the coupler 104 from the load 108 will affect the power measurement. One solution to the problem of reflection employs an isolator between the output power source 102 and the load 108. However, the use of an isolator may result in greater power loss as well as greater cost.

Systems that do not employ an isolator, such as GSM systems, require high directivity, or isolation, from reflected signals. In GSM systems, the impedance mismatch due to various antenna load conditions may result in as much as a 10:1 Voltage Standing Wave Ratio (VSWR). In this type of system, a simple one-capacitor coupler as described above can be in error by a factor of ten. For these reasons, most GSM mobile handset terminals employ elaborate distributed or lumped element couplers that have at least 10 dB of directivity. These lumped or distributed element directive couplers are typically both large and costly.

Prior art directive couplers provide an improvement in measurement accuracy over non-directive couplers in systems with variable loads, however, such couplers still produce errors in power measurement. A typical directive coupler samples a portion of an RF signal and delivers the sampled portion to a sample impedance (e.g., 50 ohms). This measurement is accurate, however, only if the load impedance is the same as the sample impedance. When the load impedance varies, errors occur in the power measurement

SUMMARY OF THE INVENTION

In accordance with one embodiment of the invention, a coupler circuit for sampling an output power of a signal from an output power source includes at least one first sampling element coupled to the output of the output power source that samples a first portion of the signal and at least one second sampling element coupled to the output of an output matching network that samples a second portion of the signal. A processor is coupled to the at least one first and second sampling elements and determines the output power based at least on the first portion of the signal and the second portion of the signal. The first and second sampling elements may be capacitors, resistors or resistor networks. In one embodiment, the output power source is a power amplifier. In another embodiment, the load has a varying load impedance.

In a further embodiment, the output matching circuit is a circuit defined by a set of S-parameters. The processor may include a first input for receiving a set of S-parameter coefficients. The processor may then determine a correction for a reflectance from the load based on the first portion of the signal, the second portion of the signal and the set of S-parameter coefficients.

In yet another embodiment, the first portion of the signal and the second portion of the signal are voltages. Alternatively, at least one of the first portion of the signal and the second portion of the signal may be a current. The load may be a variable load antenna.

In accordance with another aspect of the invention, a system for measuring the output power of a signal provide from an output power source that delivers the signal to a load includes an output matching network coupled between the output power source and the load and a coupler that includes at least one first sampling element coupled to the output of the output power source for sampling a first portion of the signal and at least one second sampling element coupled to the output of the output matching network for sampling a second portion of the signal. A detector circuit is coupled to the at least one first and second sampling elements to measure the first portion of the signal and the second portion of the signal. A processor is coupled to the detector circuit to determine the output power based at least on the first and second portion of the signal.

The first and second sampling elements may be capacitors, resistors or resistor networks. In one embodiment, the output power source is a power amplifier. In another embodiment, the load has a varying load impedance. In a further embodiment, the output matching circuit is a circuit defined by a set of S-parameters. The processor may include a first input for receiving a set of S-parameter coefficients. The processor may then determine a correction for a reflectance from the load based on the first portion of the signal, the second portion of the signal and the set of S-parameter coefficients.

In yet another embodiment, the first portion of the signal and the second portion of the signal are voltages. Alternatively, at least one of the first portion of the signal and the second portion of the signal may be a current. The load may be a variable load antenna.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In an embodiment of the invention, a coupler includes two voltage-sampling elements after an output power source, such as a power amplifier or power amplifier module. The two voltage sampling elements, such as capacitors or resistors, are separated by a delay or an S-parameter block. The difference between the two sampled signals are then manipulated to yield a coupled output power with high directivity. The coupler provides improved accuracy in applications with a variable load. One application of the coupler is in a power control loop for a mobile handset terminal for wireless applications. While embodiments of the invention will be discussed generally with reference to mobile handset terminals, it is to be understood that many signal transmission and power detection applications may similarly benefit from various embodiments and improvements that are subjects of the present invention.

Figure 2:
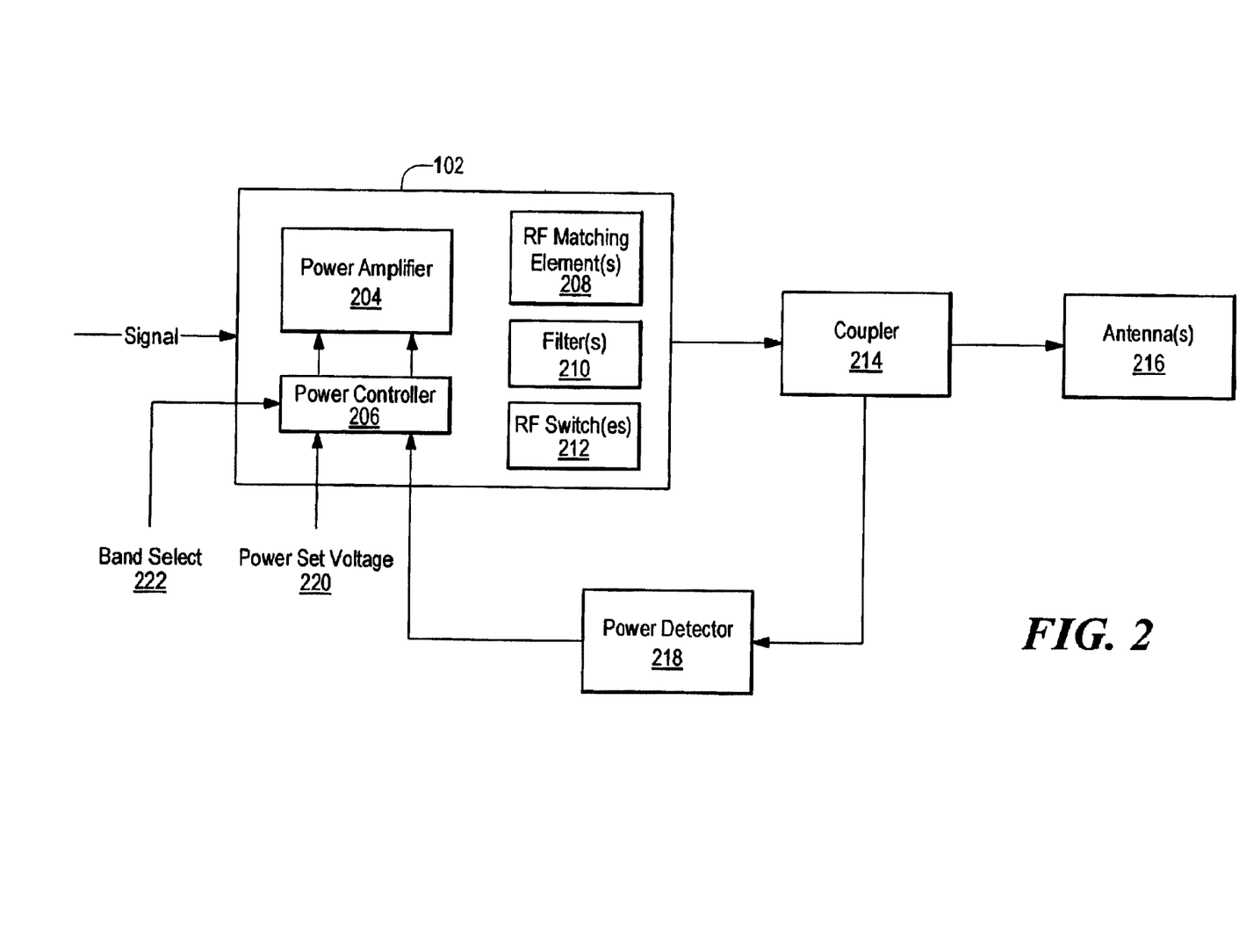
FIG. 2 is a schematic block diagram of a GSM transmitter for a mobile handset device including a power control loop.

FIG. 2 is a schematic block diagram of a GSM (Global System for Mobile communication) transmitter for a mobile handset terminal including a power control loop. An output power source 202, here a power amplifier module (PAM), coupler 214 and power detector 218 are used to create closed loop power control. Power amplifier module 202 includes a power amplifier integrated circuit 204 and a power controller integrated circuit 206. The power amplifier module 202 may also include RF matching elements 208, filters 210 and RF switches 212. Power amplifier module 202 is used to increase the input power level of the signal and deliver the RF signal with an output power level to an antenna 216 load.

To control the output power level of the RF signal, coupler 214 is used to sample the output power level and send the sampled power to a power detector 218. The power detector 218 may be, for example, a logarithmic amplifier. The sampled output power is measured by the power detector 218 and delivered to the power controller 206. Power controller 206 compares the measured output power provided by the power detector to a power set voltage 220 (i.e., a voltage corresponding to the desired power level) input to the power controller 206. The manufacturer of the mobile handset terminal must provide a power set voltage 220 that has been corrected (or calibrated) for various factors such as temperature variation, detector variation with power level and filter/coupler loss variations. These calibration corrections may be stored in memory in the mobile handset terminal.

Figure 3:
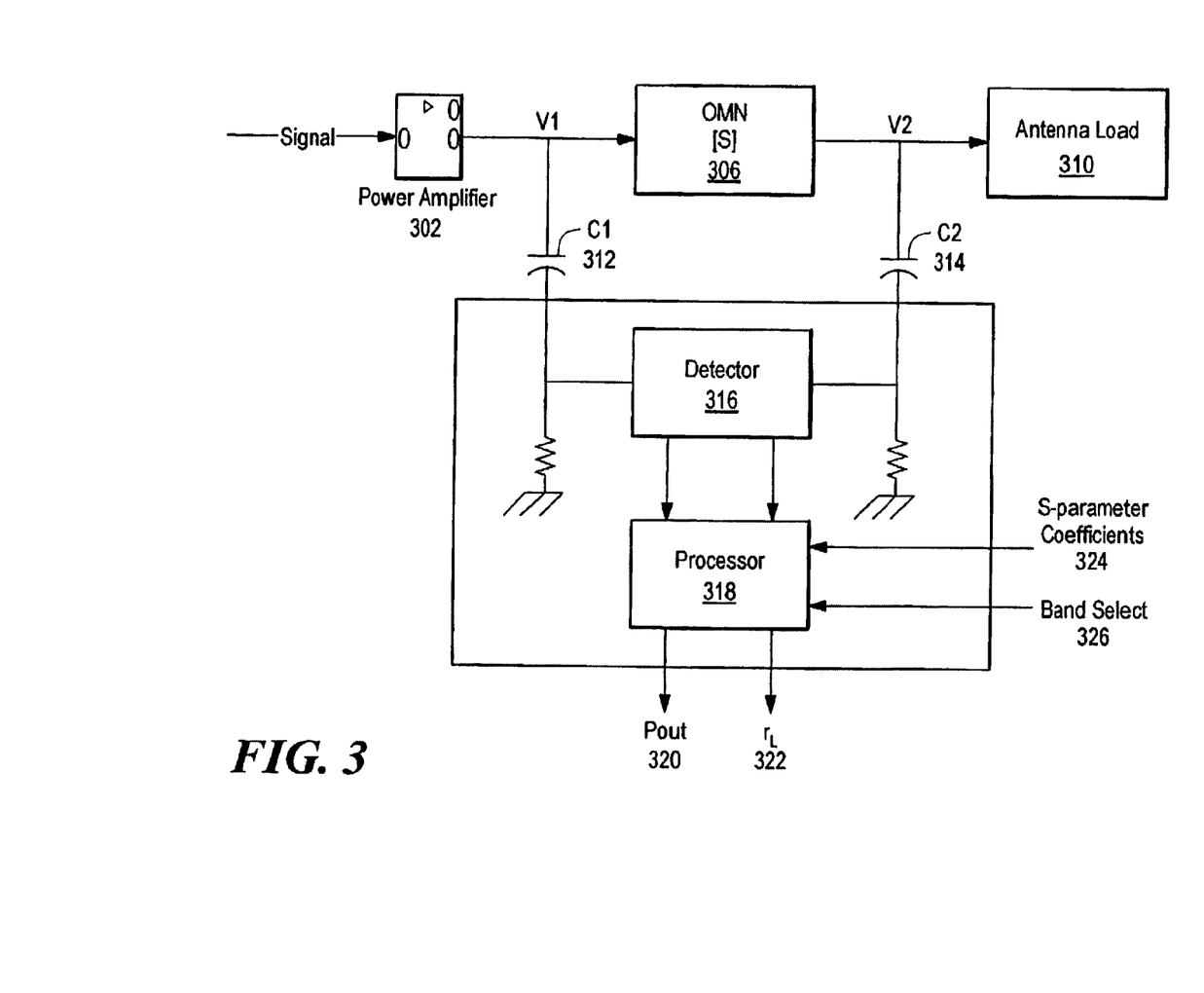
FIG. 3 is a schematic diagram of a coupler circuit in accordance with an embodiment of the invention

FIG. 3 is a schematic diagram of a coupler circuit in accordance with an embodiment of the invention. A power amplifier 302 receives a signal and delivers the signal, with an increased power level, to an antenna load 310. An output matching network (OMN) 306 is coupled to the power amplifier 302 and to the antenna load 310. The OMN is typically a passive circuit that can be defined by S-parameters. As discussed above, the antenna load may have a reflectance, $\Gamma_L$, that may affect the power measurement of the power control loop. Accordingly, directive coupling should be provided to reduce the power that comes back from the load 310 to the OMN 306 output.

A first voltage V1 is sampled at the input of the OMN 306 using a first capacitor C1 (312). A second voltage V2 is sampled after the OMN 306 and before the variable antenna load 310 using a second capacitor C2 (314). The sampled voltages V1 and V2 are directed to a detector 316 that measures the voltage signals. Detector 316 converts the magnitude and phase information from the sampled voltage signals to DC voltages. A processor 318 is then used to manipulate the sampled voltages V1 and V2 to determine the output power. The coupler circuit as shown in FIG. 3 advantageously includes directivity to correct for any reflection ($\Gamma_L$) at the output of the coupler due to a change in the load 310.

The processor may determine the voltage gain of OMN 306 using the following equation [1]:

$$A_V = \frac{V_1}{V_2} = \frac{S_{21}(1+\Gamma_L)}{(1-S_{22}\Gamma_L)+S_{11}(1-S_{22}\Gamma_L)+S_{21}S_{12}\Gamma_L}$$

Equation [1] may be solved to determine the load reflectance [2]:

$$\Gamma_L = \frac{A_V(1+S_{11})-S_{21}}{A_V(S_{22}+S_{11}S_{22}-S_{21}S_{12})+S_{21}}$$

The new load impedance may be calculated from the reflection coefficient as [3]:

$$Z_L = Z_0 \frac{1+\Gamma_L}{1-\Gamma_L}$$

The power, $P_{out}$, delivered from the power amplifier 302 to the antenna 310 will be [4]:

$$P_{out} = \frac{\text{Re}(V_2 * I *_{out})}{2} = \text{Re}\left[\frac{V_2 * V_2 *}{2 * Z_L}\right]$$

Various simplifications known to those skilled in the art may be made to the above equations to aid in the signal processing. Further simplifications may also be made at the expense of accuracy.

By detecting the voltage at the input and output of a matching circuit (e.g., OMN 306) with known S-parameters, a true measurement of the output power of the power amplifier 302 may be made. As shown in FIG. 3, the detector 316 and processor 318 may be included on the same integrated circuit. The S-parameter coefficients 324 are input to the processor 318 in order to make the determination of the output power $P_{out}$ (320). In various embodiments, the S-parameter coefficients may be programmed using either off-chip components, voltages or digital inputs. This allows the coupler circuit to be used in connection with a variety of OMN's 306. A band select input 326 may be used in conjunction with the S-parameter coefficients to determine the output power for multiple bands of the power amplifier 302.

Figure 4:
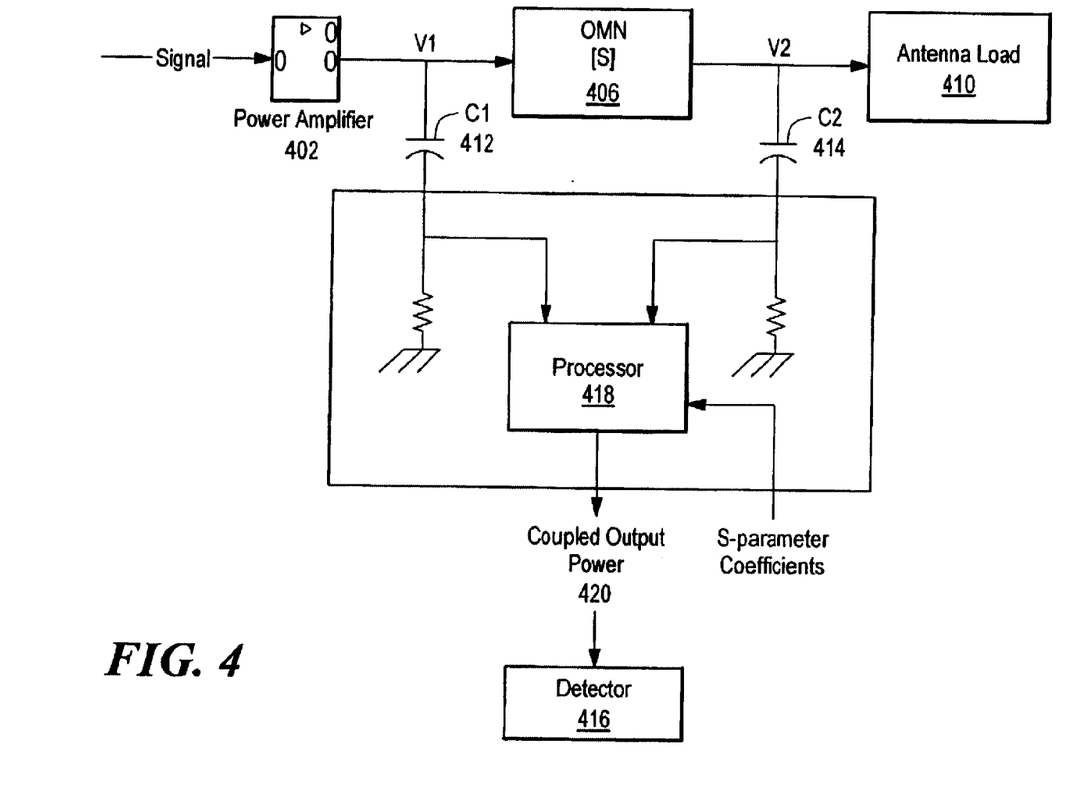
FIG. 4 is a schematic diagram of a coupler circuit in accordance with an alternative embodiment of the invention.

FIG. 4 is a schematic diagram of a coupler circuit in accordance with an alternative embodiment of the invention. In FIG. 4, the sampled waveforms V1 and V2 are processed directly by the processor 418. Both the amplitude and phase information of each signal, V1 and V2, is retained. Processor 418 manipulates the sampled voltages to determine a coupled output power in a similar manner as described above with respect to FIG. 3. The coupled output power 420 is then directed to a detector circuit 416. Detector 416 will convert the magnitude and phase information from the coupled output power signal 420 to a DC voltage and determine the measured output power. As discussed above, the coupler circuit, as shown in FIG. 4, advantageously includes directivity to correct for any reflectance ($\Gamma_L$) due to a change in the load 410.

Figure 5:
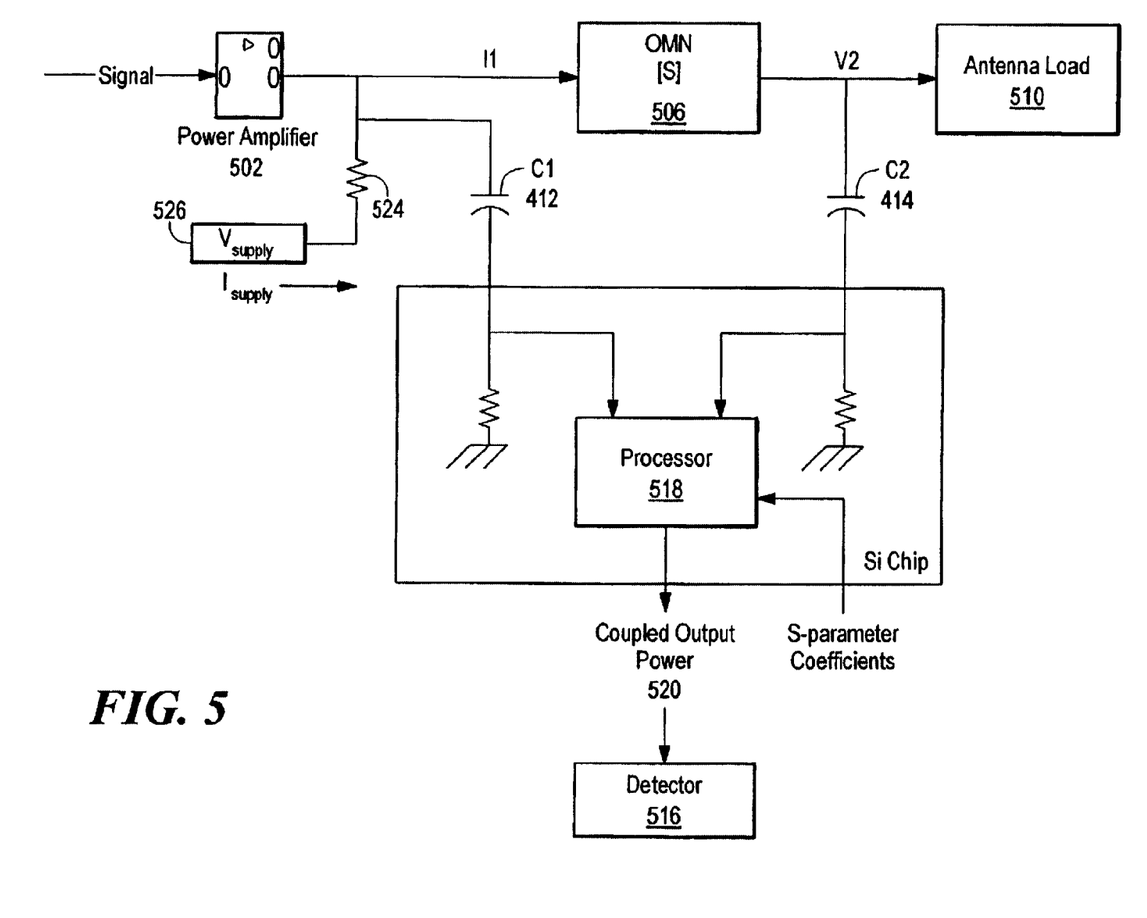
FIG. 5 is a schematic diagram of a coupler circuit in accordance with an alternative embodiment of the invention.

FIG. 5 is a schematic block diagram of a coupler circuit in accordance with an alternative embodiment of the invention. In this embodiment, a sampled current I1 and a sampled voltage V2 are used to determine the coupled output power 520. A resistor 524 is used to sample a current I1 at the output of the power amplifier 502 using a supply voltage 524 and current. The sample current signal and the sampled voltage signal are used by the processor to determine a coupled output power 520 in a manner similar to that described above with respect to FIG. 3 and FIG. 4. Detector 516 converts the magnitude and phase information from the coupled output power signal 520 to a DC voltage and determines the measured output power.

Figure 6:
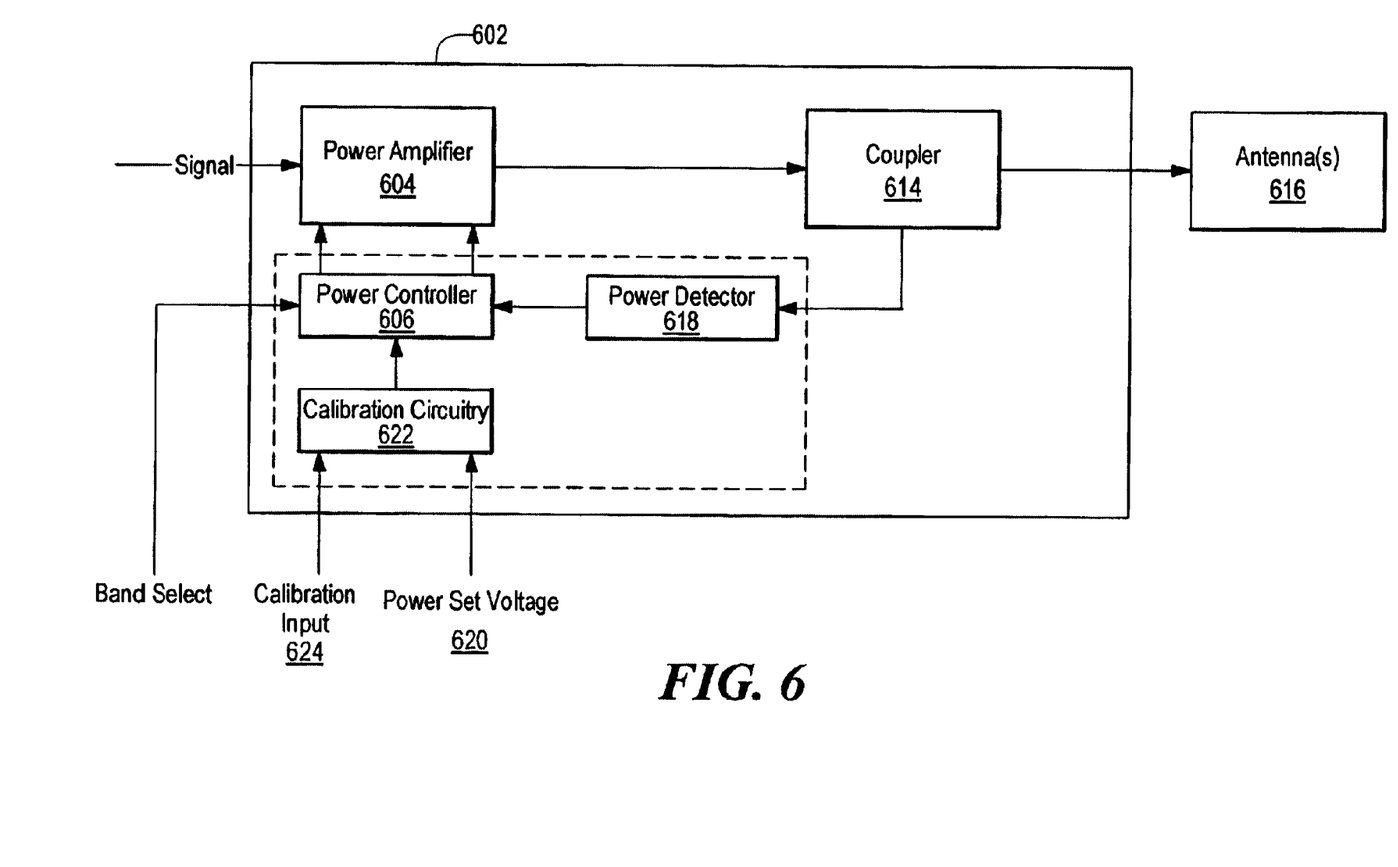
FIG. 6 is a schematic block diagram of a power amplifier module including the coupler of FIG. 3 in accordance with an embodiment of the invention.

FIG. 6 is a schematic block diagram of a power amplifier module including a coupler in accordance with an embodiment of the invention. The coupler circuit as described above may be included in a PAM 602 as shown in FIG. 6. PAM 602 advantageously incorporates power measurement, control and calibration functions. A calibrated PAM, as shown in FIG. 6, is described in further detail in co-pending U.S. patent application Ser. No. 10/017,526, now U.S. Pat. No. 6,642,784, filed on even date herewith, attorney docket number 2550/110, entitled "Calibrated Power Amplifier Module", which is herein incorporated by reference in its entirety.

In FIG. 6, coupler 614 is used in a power control loop for the power amplifier module 602. Coupler 614 is used to sample the output power of a power amplifier 604 and deliver the sampled power to a power detector 618. Power detector 618 measures the output power and provides the measured output power to a power controller 606 that compares the measured output power to a desired power level. Based on the comparison, power controller 606 produces a control signal for power amplifier 604 so that the output power level of the power amplifier matches the desired power level.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

I claim:

1. A coupler circuit for sampling an output power of a signal from an output power source that delivers the signal to a load, where an output matching network is coupled between the output power source and the load, the coupler circuit comprising:
   at least one first sampling element coupled to an output of the output power source for sampling a first portion of the signal;
   at least one second sampling element coupled to an output of the output matching network for sampling an second portion of the signal; and
   a processor coupled to the at least one first and second sampling elements for determining the output power based at least on the first portion of the signal and the second portion of the signal.

2. The coupler circuit according to claim 1, wherein the first sampling element and the second sampling element are capacitors.

3. The coupler circuit according to claim 1, wherein the first sampling element is a resistor and the second sampling element is a capacitor.

4. The coupler circuit according to claim 1, wherein at least one of the first and second sampling elements is a resistor.

5. The coupler circuit according to claim 1, wherein at least one of the first and second sampling element is a resistor network.

6. The coupler circuit according to claim 1, wherein the output power source is a power amplifier.

7. The coupler circuit according to claim 1, wherein the load has a varying load impedance.

8. The coupler circuit according to claim 1, wherein the output matching network is a circuit defined by a set of S-parameters.

9. The coupler circuit according to claim 8, wherein the processor includes a first input for receiving a set of S-parameter coefficients.

10. The coupler circuit according to claim 9, wherein the processor determines a correction for a reflectance from the load based on the first portion of the signal, the second portion of the signal and the set of S-parameter coefficients.

11. The coupler circuit according to claim 1, wherein the first portion of the signal is a voltage and the second portion of the signal is a voltage.

12. The coupler circuit according to claim 1, wherein the load is variable load antenna.

13. The coupler circuit according to claim 1, wherein at least one of the first portion of the signal and the second portion of the signal is a current.

14. A system for measuring the output power of a signal provided from an output power source that delivers the signal to a load, the system comprising
   a. an output matching network coupled between the output power source and the load;
   b. a coupler in signal communication with the output matching network comprising
      (1) at least one first sampling element coupled to an output of the output power source for sampling a first portion of the signal;
      (2) at least one second sampling element coupled to an output of the output matching network for sampling an second portion of the signal;
   c. a detector circuit coupled to the at least one first sampling element and the at least one second sampling element for measuring the first portion of the signal and the second portion of the signal; and
   d. a processor coupled to the detector circuit for determining the output power based at least on the first portion of the signal and the second portion of the signal.

15. A The system according to claim 14, wherein the first sampling element and the second sampling element are capacitors.

16. The system according to claim 14, wherein the first sampling element is a resistor and the second sampling element is a capacitor.

17. The system according to claim 14, wherein at least one of the first and second sampling elements is a resistor.

18. The system according to claim 14, wherein at least one of the first and second sampling elements is a resistor network.

19. The system according to claim 14, wherein the output power source is a power amplifier.

20. The system according to claim 14, wherein the load has a varying load impedance.

21. The system according to claim 14, wherein the load is a variable load antenna.

22. The system according to claim 14, wherein the output matching network is a circuit defined by a set of S-parameters.

23. The system according to claim 22, wherein the processor includes a first input for receiving a set of S-parameter coefficients.

24. The system according to claim 23, wherein the processor determines a correction for a reflectance from the load based on the first portion of the signal, the second portion of the signal and the set of S-parameter coefficients.

25. The system according to claim 14, wherein the first portion of the signal is a voltage and the second portion of the signal is a voltage.

26. The system according to claim 14, wherein at least one of the first portion of the signal and the second portion of the signal is a current.

\* \* \* \* \*